United States Patent
Suzuki

(10) Patent No.: US 6,809,536 B2
(45) Date of Patent: Oct. 26, 2004

(54) APPARATUS FOR MEASURING PROPERTIES OF PROBE CARD AND PROBING METHOD

(75) Inventor: Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/406,192

(22) Filed: Apr. 4, 2003

(65) Prior Publication Data

US 2003/0173951 A1 Sep. 18, 2003

Related U.S. Application Data

(63) Continuation-in-part of application No. PCT/JP02/07205, filed on Jul. 16, 2002.

(30) Foreign Application Priority Data

Aug. 6, 2001 (JP) .......................................... 2001-237642

(51) Int. Cl.$^7$ ............................................. G01R 31/02
(52) U.S. Cl. ..................................... 324/754; 324/750
(58) Field of Search .............................. 324/754, 750, 324/158.1, 755, 763, 764, 765, 759, 523, 527, 528, 605, 667; 438/78

(56) References Cited

U.S. PATENT DOCUMENTS 6,257,053 B1 * 7/2001 Tomita et al. ................. 73/105
6,278,113 B1 * 8/2001 Murayama et al. ......... 250/306

FOREIGN PATENT DOCUMENTS

| JP | 5-157790 | 6/1993 |
| JP | 5-264590 | 10/1993 |
| JP | 6-21166 | 1/1994 |
| JP | 7-231018 | 8/1995 |
| JP | 11-251379 | 9/1999 |

* cited by examiner

Primary Examiner—Kamand Cuneo
Assistant Examiner—Trung Q. Nguyen
(74) Attorney, Agent, or Firm—Oblon, Spivak, McClelland, Maier & Neustadt, P.C.

(57) ABSTRACT

A measuring apparatus for measuring the properties of a probe card comprises a load cell, which is placed on a main chuck and detects a load from a probe card, and a displacement sensor which detects the absolute displacement of the probe card when the main chuck ascends and presses the probe card.

13 Claims, 5 Drawing Sheets

APPARATUS FOR MEASURING PROPERTIES OF PROBE CARD AND PROBING METHOD

CROSS-REFERENCE TO RELATED APPLICATIONS

This is a Continuation-in-Part Application of PCT Application No. PCT/JP02/07205, filed Jul. 16, 2002, which was not published under PCT Article 21(2) in English.

This application is based upon and claims the benefit of priority from the prior Japanese Patent Application No. 2001-237642, filed Aug. 6, 2001, the entire contents of which are incorporated herein by reference.

BACKGROUND OF THE INVENTION

1. Field of the Invention

The present invention relates to a measuring apparatus for measuring the properties of a probe card (e.g., displacement attributable to the deflection of the probe card under measurement) used in a probe unit, the probe unit having the measuring apparatus, and a probing method.

2. Description of the Related Art

In an inspection process for a semiconductor apparatus, for example, a probe unit is widely used to check a semiconductor wafer (hereinafter referred to simply as a "wafer"). Usually, the probe unit comprises a loader chamber and a prober chamber. The loader chamber comprises a carrier stage portion, a wafer transportation mechanism, and a pre-alignment mechanism (hereinafter referred to as a "sub-chuck"). The carrier stage portion carries thereon carriers that store a plurality (e.g., 25) of wafers. The wafer transportation mechanism transports the wafers one after another from the carrier stage portion. The sub-chuck pre-aligns the wafers that are transported by means of the wafer transportation mechanism. The prober chamber comprises a stage (hereinafter referred to as a "main chuck"), moving mechanism, probe card, alignment mechanism, and test head. The main chuck carries the wafer thereon. The moving mechanism moves the stage in the X-, Y-, Z-, and θ-directions. The probe card is located over the main chuck. The alignment mechanism, in conjunction with the moving mechanism for the main chuck, aligns the wafer with respect to the position of the probe card. The test head is located between the probe card and a tester.

In measurement, the main chuck carrying thereon a wafer that is aligned with the probe card is raised. Probes of the probe card are brought into contact with electrodes of a semiconductor device (hereinafter referred to as a "device") on the wafer under an optimum probe pressure. Specified electrical properties of the device are measured in a manner such that a signal for measurement from the tester is applied to the device and received through the test head and the probes. Then, the main chuck that carries the wafer thereon is indexed, and the properties of the device are measured in succession by repeating the aforesaid steps of procedure. Electrical contact between the electrodes of the device and the probes can be secured by overdriving the main chuck for a given value in bringing the electrodes of the device and the probes into contact with one another.

When the main chuck is in an overdriven state, however, the probe card receives a force of pressure from the main chuck through its probes. In consequence, the probe card is displaced in the vertical direction (Z-direction). This displacement varies depending on the static stiffness of the probe card and the main chuck.

Conventionally, a measuring apparatus that is provided with a laser displacement gage measures this static stiffness. This measuring apparatus comprises a plate equal to the probe card in diameter and having mechanical properties similar to those of the probe card, a cylinder mounted on the plate, and the laser displacement gage. In measuring the static stiffness, the plate of the measuring apparatus is attached to an attachment region of the probe card. In this state, the same load for the overdriving operation is applied to the main chuck through the cylinder on the plate. The laser displacement gage measures the displacement of the main chuck in the Z-direction.

In a measuring method based on the conventional measuring apparatus, however, the plate is attached to the attachment region of the probe card, so that the displacement of the probe card in the Z-direction is ignored. More specifically, in the conventional measuring apparatus, the main chuck is pressed by means of the cylinder that is attached to the plate. In this pressed state, the laser displacement gage that is attached to the plate measures the Z-direction displacement between the plate and the main chuck. Therefore, the plate itself is bent by the force of pressure from the cylinder. The laser displacement gage can measure the comparative displacement (relative displacement) between the main chuck and the probe card that involves the deflection of the probe card. However, the Z-direction displacement (absolute displacement) of the plate that is attributable to the deflection cannot be measured.

The deflection of the plate as the alternative of the probe card is different from that of the probe card. In consequence, the deflection of the probe card under actual inspection cannot be measured accurately.

Thus, the absolute displacement of the probe card cannot be measured, so that the relation between the overdrive value of the main chuck and load cannot be obtained accurately. It is hard to set the overdrive value of the main chuck appropriately.

With the development of wafers having larger diameters and ultrahigh-integration devices, development of larger multi-pin probe cards has recently been promoted. In consequence, the load from the probe card that acts on the main chuck becomes heavier, so that the displacement of the probe card increases. The substantial displacement of the probe card has an influence upon the reliability of the measurement.

Based on these circumstances, the absolute displacement of the probe card can be measured according to the present invention. According to embodiments of the present invention, the relation between the overdrive value of the stage and the load can be obtained accurately, and the appropriate overdrive value can be set.

BRIEF SUMMARY OF THE INVENTION

According to the first aspect of the present invention, there is provided a measuring apparatus for measuring the properties of a probe card, comprising: a stage; a holding mechanism located over the stage (the holding mechanism holding a probe card having probes or a probe card having no probes); a lift mechanism which causes the stage to ascend and descend toward the probe card; a load sensor which detects the load the stage receives from the probe card when the lift mechanism rises toward and brings the stage into contact with the probe card; and a displacement sensor which detects the absolute displacement of the probe card, which has been caused by the load.

It is desirable to arrange the contact block on the stage in the measuring apparatus.

It is also desirable that the load sensor be provided between the stage and the contact block in the measuring apparatus.

Preferably, at least one of the load sensor and the displacement sensor is removably located in the apparatus.

Preferably, the displacement sensor of the measuring apparatus measures at least one of the displacement of the probe card and the stage.

Preferably, the displacement sensor of the measuring apparatus measures the displacement of the contact block.

Preferably, the displacement sensor of the measuring apparatus detects the position of the contact block when the probe card and the contact block contact each other and when the stage further moves up and receives a prescribed load from the probe card.

Preferably, the displacement sensor of the measuring apparatus is an eddy-current displacement sensor.

Preferably, the load sensor of the measuring apparatus is placed on the stage.

Preferably, the measuring apparatus has a positioning plate for positioning the load sensor on the center part of the stage.

Preferably, the displacement sensor of the measuring apparatus detects at least one of the position of the probe card and the position of the stage when the probe card and the stage contact each other and when the stage further moves and receives a prescribed load from the probe card.

Preferably, the measuring apparatus further comprises a memory which stores the measured characteristic values of the probe card.

According to another aspect of the invention, there is provided a measuring apparatus for inspecting the electrical properties of an to-be-inspected object. The apparatus comprises: a stage which holds the to-be-inspected object, a holding mechanism which is provided above the stage the holding mechanism holds one of a probe card having a plurality of probes and a probe card having no probes; a lift mechanism which moves up the stage toward the probe card and moving down the stage from the probe card; a load sensor which is removable and detects a load which the stage receives from the probe card when the lift mechanism moves up the stage, and a displacement sensor which is removable and detects an absolute displacement which the probe card undergoes upon receiving the load.

Preferably, the probe apparatus comprise a contact block which is removably provided on the stage.

Preferably, the load sensor is provided between the stage and the contact block.

Preferably, the probe apparatus comprise a storage unit which stores data which represents a relation between an over-drive distance and a probe pressure of the probe, the over-drive distance and the probe pressure being based on the absolute displacements measured at different temperature.

Preferably, the measuring apparatus further comprises a contact block removably located on the stage.

Preferably, the displacement sensor of the measuring apparatus measures the displacement of at least one of the probe card and the stage.

Preferably, the displacement sensor of the measuring apparatus measures the displacement of the contact block.

Preferably, the displacement sensor of the measuring apparatus is an eddy-current displacement sensor.

Preferably, the load sensor of the measuring apparatus is removably placed on the stage.

Preferably, the measuring apparatus further comprises a memory which stores the measured characteristic values of the probe card.

According to the third aspect of the present invention, there is provided a method of measuring the properties of a probe card, comprising: (a) holding one of a probe card having probes and a probe card having no probes by means of a holding mechanism; (b) raising and bringing a stage into contact with the probe card; (c) overdriving the stage; (d) detecting the load the stage receives from the probe card by the overdriving; (e) detecting the absolute displacement of the probe card by the overdriving ((d) and (e) being executable in the order of (d) and (e) or in the order of (e) and (d)).

Preferably, in this method, the detection of the load of (d) and the detection of the displacement of (e) are carried out at a plurality of temperatures.

Preferably, this method further comprises (f) storing in a memory at least one of the detected load and displacement.

Preferably, in this method, the detection of the load of (d) and the displacement of (e) are carried out by using the probe card having probes, the detection of the load of (d) and the detection of the displacement of (e) are carried out by using the probe card having no probes, and a given overdrive value is calculated in accordance with the two detected displacements.

BRIEF DESCRIPTION OF THE SEVERAL VIEWS OF THE DRAWING

FIGS. 3A and 3B are diagrams for illustrating the operation of the measuring apparatus of the present invention for measuring the properties of the probe card shown in FIGS. 1 and 2, in which FIG. 3A is a view showing the probe card and a load cell in contact with each other, and FIG. 3B is a view showing a main chuck in an overdriven state;

DETAILED DESCRIPTION OF THE INVENTION

Figure 1:
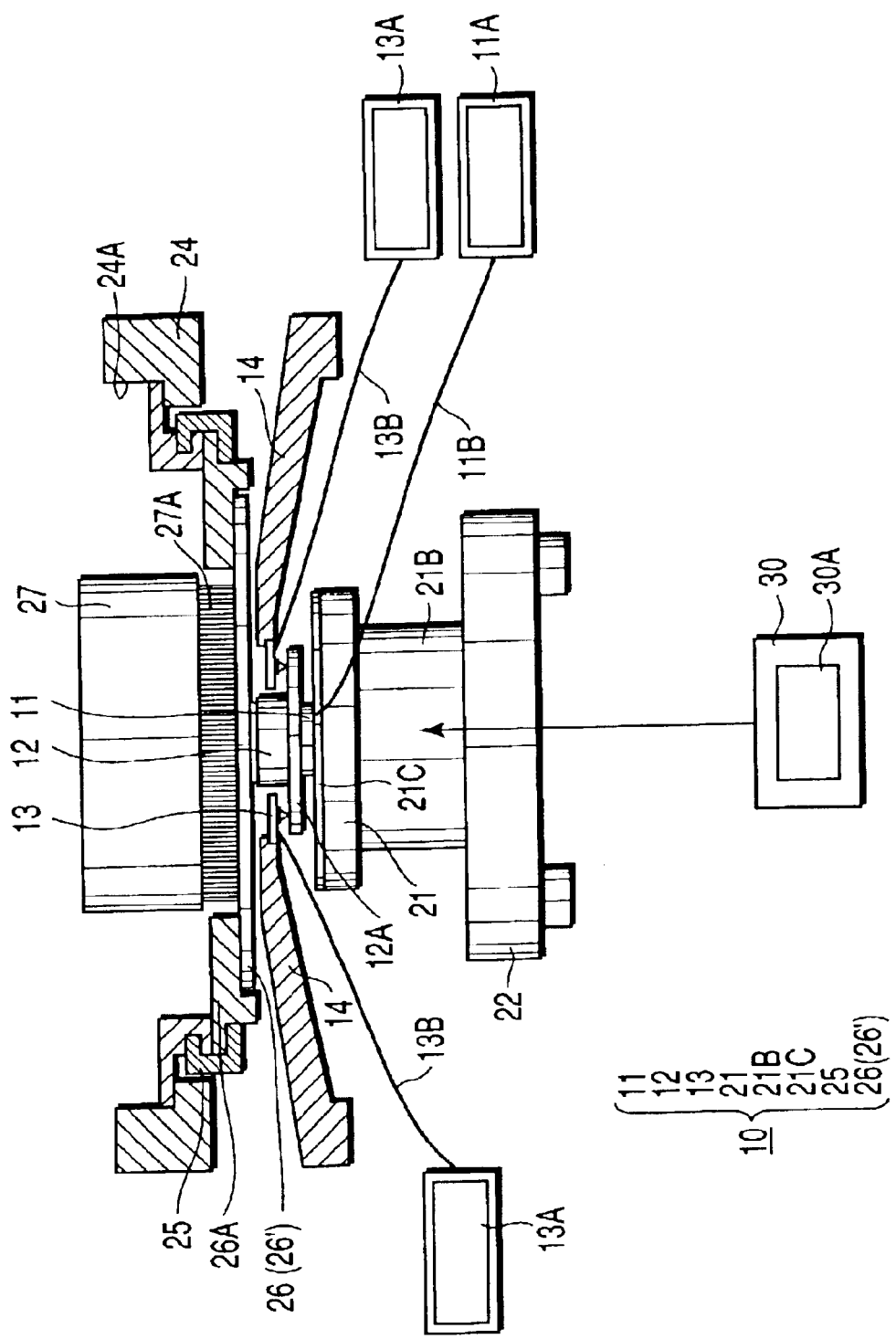
FIG. 1 is a diagram showing an embodiment of a measuring apparatus for measuring the properties of a probe card of the present invention.

The present invention will now be described from the embodiments shown in FIGS. 1, 3A, 3B, 4 and 5. FIG. 1 shows an embodiment of a measuring apparatus 10 for measuring the properties of a probe card of the present invention. As shown in FIG. 1, the measuring apparatus 10 of this embodiment comprises a stage (main chuck) 21 that carries an object of inspection (e.g., wafer (not shown)) thereon and a lift mechanism 21B for moving the main chuck 21 in the Z-direction. A head plate 24 is located on the top face of a measuring chamber. The head plate 24 has a circular hole 24A. The hole 24A is provided with a probe card clamp mechanism 25. The probe card clamp mechanism 25 is provided with a probe card 26 that is removably attached by means of a cardholder 26A. The probe card 26 may be a probe card 26 having probes or a probe card 26' having no probes. Further, the probe card 26 is connected to a connecting ring 27. The measuring apparatus 10 can also comprise a test head (not shown in FIG. 1) that is connected to the connecting ring 27. The connecting ring 27 can be provided with contact terminals 27A such as pogo pins. The measuring apparatus 10 that determines the properties of the probe card is driven under the control of a control device 30. The control device 30 is provided with a storage section 30A. The storage section 30A stores the properties of the probe card 26 (26') that are obtained by means of the measuring apparatus 10.

As shown in FIG. 1, the probe card property measuring apparatus 10 of the present embodiment comprises a load sensor (load cell) 11, a contact block 12, and displacement sensors 13. The contact block 12 can be held in place by a chuck or can be removably arranged. The displacement sensor detects at least one of the position of the probe card, the position of the main chuck and the position of the contact block when the probe card and the contact block contact each other and when the stage further moves up and receives a prescribed load from the probe card. The load sensor 11 can be arranged between the main chuck 21 and the contact block. The load sensor 11 detects the load that the probe card 26 (26') applies to the main chuck via the contact block 12 when the main chuck 21 moves up and pushes the probe card 26. The displacement sensors 13 detect the lift of the main chuck 21. This lift is equivalent to the displacement of the probe card 26 (26') that is bent under the force of pressure from the main chuck 21.

More specifically, the displacement sensors 13 detect the lift of the contact block 12 that ascends during the time interval that elapses from the instant that the main chuck 21 ascends to bring the contact block 12 into contact with the probe card 26 (26') until the load sensor 11 detects a given load (equal to the load for the time of inspecting the wafer). The then lift of the contact block 12 is equivalent to the displacement (absolute displacement) or the extent of deflection or change of the probe card 26 caused by the lifting force from the contact block 12.

Any of various measuring means (e.g., conventional measuring means) can be used as the load cell 11. The load cell 11 and the contact block 12 of the present embodiment can each be formed in the shape of a circular column, for example. A flange 12A can be formed on the lower part of the contact block 12. Preferably, the load cell 11 is placed in the center of the main chuck 21 as it is used. A positioning plate 21C can be used to locate the load cell 11 in the center of the main chuck 21. This positioning plate 21C can be a thin ring-shaped plate that is made of plastics, for example. It can be formed so that its outside diameter is equal to the outside diameter of the upper surface of the main chuck 21 and its inside diameter is equal to the outside diameter of the lower end of the load cell 11. The positioning plate 21C can have a smaller size than the upper surface of the main chuck 21.

Thus, the positioning plate 21C is located on the upper surface of the main chuck 21, and the load cell 11 is located in its center hole. In consequence, the load cell 11 can be accurately situated on the central portion of the main chuck 21.

The load cell 11 is connected to an indicator 11A by means of a wire 11B. The indicator 11A can digitally indicate in kilograms the load from the probe card, which is detected by means of the load cell 11.

Various types may be used for the displacement sensors 13. Preferably, the displacement sensors 13 of the present embodiment are eddy-current displacement sensors. The displacement sensors 13 are individually connected to indicators 13A by means of wires 13B. A target of the displacement sensors 13 can be the upper surface of the flange of the contact block 12. The distance from the target that is detected by means of the displacement sensors 13 can be digitally indicated in microns on the indicators 13A. The displacement sensors 13 can be arranged in a plurality of positions (e.g., on three spots) at equal spaces in the circumferential direction of a ring-shaped plate base of, e.g., metal or the like.

For convenience' sake, the ring-shaped plate base that has the displacement sensors 13 will hereinafter be referred to as a displacement sensor 13. As shown in FIG. 1, the displacement sensor 13 can be attached to the center of a platelike support 14. As shown in the same drawing, the support 14 that has the displacement sensor 13 can be located somewhat below the probe card 26 and above the main chuck 21, in the measuring chamber. The support 14 can be formed of a horizontal portion in the center and a slanting portion that inclines downward from the horizontal portion to the opposite ends, left and right. The horizontal portion has a circular aperture for the attachment of the displacement sensor 13.

As shown in FIG. 1, the inside diameter of the displacement sensor 13 is greater than the outside diameter of the contact block 12. When the main chuck 21 ascends, therefore, the upper part of the contact block 12 can penetrate the displacement sensor 13. The flange 12A of the contact block 12 can be formed of metal. Preferably, the outside diameter of the flange 12A is greater than the inside diameter of the displacement sensor 13 and smaller than the outside diameter of the sensor 13.

Thus, the flange 12A, which is situated right under the displacement sensor 13, can serve as the target of the displacement sensor 13.

The operation of the measuring apparatus 10 for measuring the properties of the probe card 26' having no probes will now be described with reference to FIGS. 3A and 3B. The measuring apparatus 10 of the present embodiment measures the properties of the probe card 26 before it carries out the wafer inspection.

The positioning plate 21C is located on the upper surface of the main chuck 21. The load cell 11 is located on the center of the main chuck 21. The support 14 is located in the measuring chamber. The measuring apparatus 10 is installed in this manner.

Then, the measuring apparatus 10 for measuring the properties of the probe card detects the displacement of the probe card 26' that is attributable to deflection. As shown in FIG. 3A, the main chuck 21 ascends together with the contact block 12, whereupon the contact block 12 comes into contact with the probe card 26' that has no probes. Whether or not the contact block 12 is brought into contact with the probe card 26' can be determined according to the indication on the indicator 11A of the load cell 11. When the contact block 12 touches the probe card 26', the indicated value on the indicator 13A of the displacement sensor 13 is set to zero.

Figure 3A:
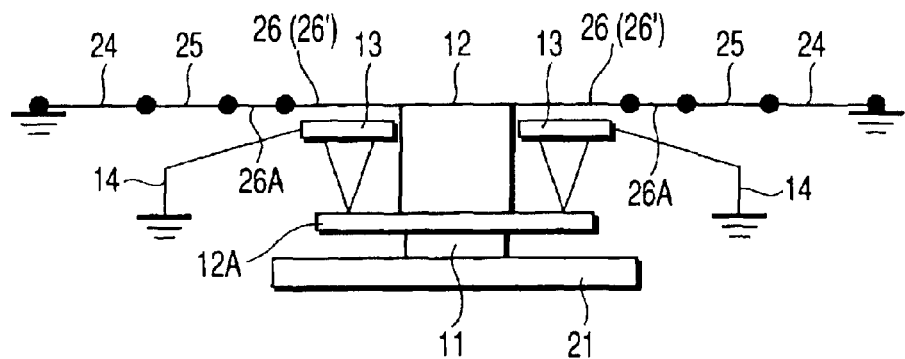
Figure 3B:
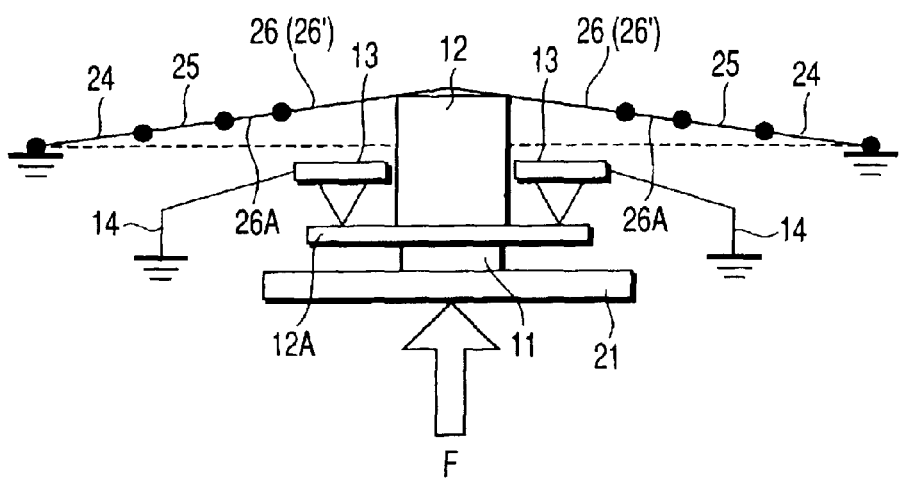
Figure 4:
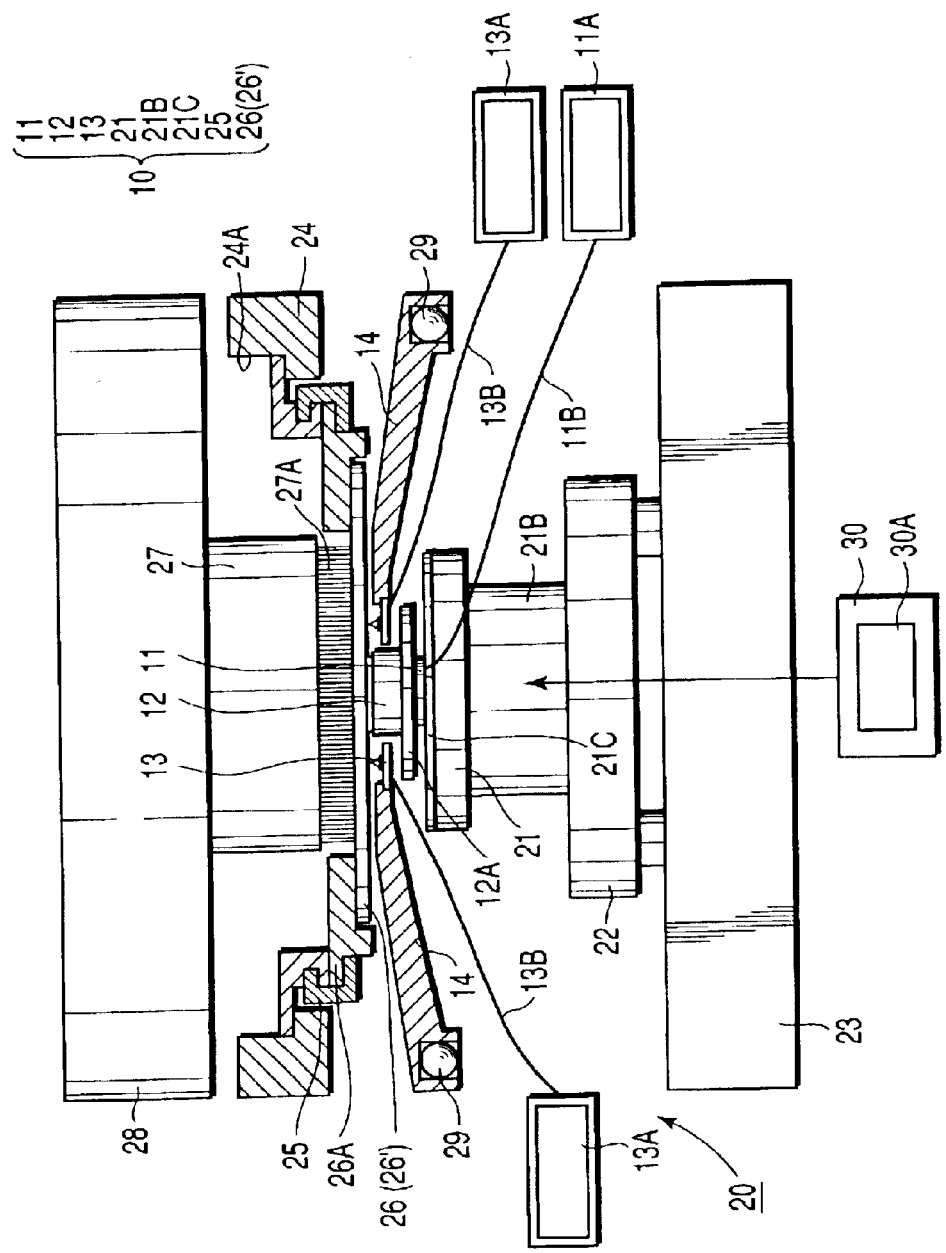
FIG. 4 is a diagram showing an embodiment in which a displacement sensor directly measures the distance from the probe card.
Figure 5:
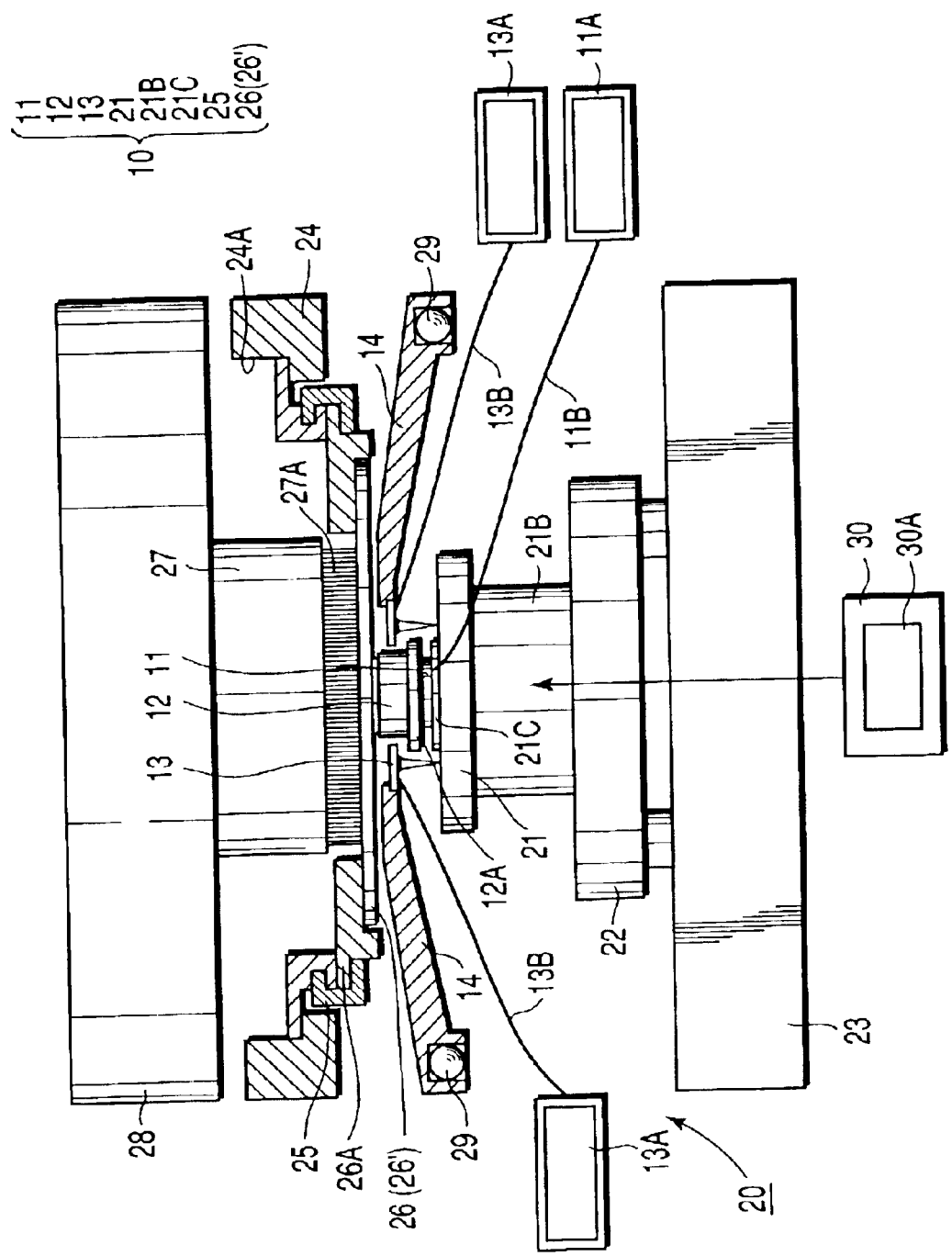
FIG. 5 is a diagram for illustrating an embodiment in which the displacement sensor 13 measures the distance from the surface of the main chuck 21.

As shown in FIG. 3B, the main chuck 21 ascends, whereupon the contact block 12 applies a load F to the probe card 26'. The main chuck 21 ascends so that the indicator 11A of the load cell 11 detects the given load. As the main chuck 21 ascends, the member comprising the head plate 24, card clamp mechanism 25 and probe card 26' is gradually bent, as shown in FIG. 3B, from the position indicated by the broken line. The indicator 13A of the displacement sensor 13 indicates the distance of ascent of the contact block 12 in microns. This distance of ascent is the absolute displacement of the mounting surface of the probe card 26'. The main chuck 21 stops when the indicator 11A of the load cell 11 indicates the given load (necessary load for the wafer measurement).

The value then indicated by the indicator 13A of the displacement sensor 13 is the absolute displacement of the probe card 26' obtained when the to-be-inspected object is measured for electrical properties. The relationship between the load on the probe card 26' and the absolute displacement of the entire mounting surface of the probe card 26' can be obtained by this series of operations.

In this manner, the relationship between the absolute displacement and the load is obtained by using the probe card 26' that has no probes. The absolute displacement of the probe card 26 that has probes can be measured by measuring the probe card 26 having probes in the same manner.

The difference between the absolute displacement of the probe card 26 having probes and the absolute displacement of the probe card 26' having no probes is the overdrive value of the main chuck 21. This result gives the relationship between the overdrive value and the probe pressure. A probe unit 20, which is controlled in accordance with this relationship between the overdrive value and the probe pressure, can check the to-be-inspected object for electrical properties under an appropriate probe pressure.

Depending on the to-be-inspected object (e.g., device formed on a wafer), the electrical properties are checked at various temperatures from low temperature to high temperature. According to the present embodiment, the measuring apparatus 10 for measuring the properties of the probe card can measure the absolute displacements of the probe card at various temperatures. Data on the relationship between the overdrive value and the probe pressure obtained in accordance with these measurement results can be stored in the storage section 30A of the control device 30 of the probe unit 20.

When the probe unit 20 checks the to-be-inspected object (device on the wafer) for electrical properties, the probe unit 20 reads from the storage section 30A the data on the relationship between the overdrive value and the probe pressure for the temperature at which the to-be-inspected object is to be checked. Based on the relationship data, the probe unit 20 controls the overdrive value of the main chuck 21. In consequence, the probe unit 20 can accurately manage the overdrive value of the main chuck 21 for the given inspection temperature and check the to-be-inspected object for electrical properties under the appropriate probe pressure, so that the reliability of the inspection can be improved.

The following is a description of a probing method of the present invention that is carried out by the use of the measuring apparatus for measuring the properties of the probe card of the present embodiment.

(a) Before the wafer inspection, the measuring apparatus 10 measures the absolute displacement of the probe card 26 at the given temperature. This given temperature may be one temperature or consist of a plurality of temperatures.

(b) The data on the relationship between the overdrive value and the probe pressure based on this absolute displacement is stored in the storage section 30A of the control device 30.

(c) The data on the relationship between the overdrive value and the probe pressure for the given inspection temperature is read from the storage section 30A.

Figure 2:
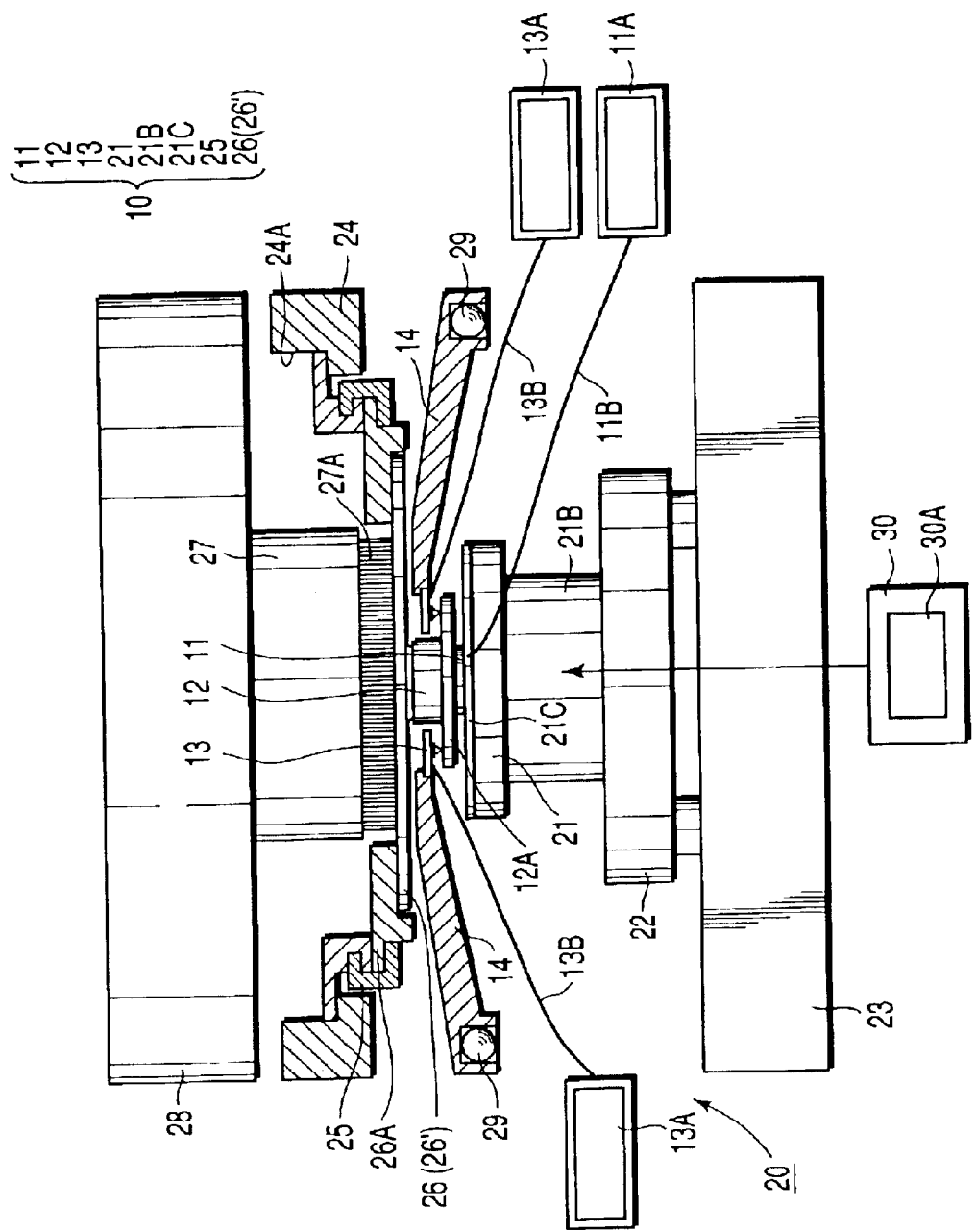
FIG. 2 is a diagram showing the an embodiment in which a measuring apparatus of the present invention for measuring the properties of a probe card is incorporated in a probe unit.

(d) Based on this relationship between the overdrive value and the probe pressure, the overdrive value of the main chuck 21 is controlled. More specifically, the wafer is placed on the main chuck 21 of the probe unit 20 (FIG. 2). After the main chuck 21 is moved in the X- and Y-directions to be aligned with the wafer under the control of the control device 30, the main chuck 21 is raised in the Z-direction, whereupon the main chuck 21 is brought into contact with the probe card. The control device 30 controls the main chuck 21 so as to overdrive it for an optimum overdrive value. The probe unit 20 can check the device on the wafer for electrical properties with the probes of the probe card 26 electrically in contact with the device under an optimum probe pressure.

According to the present embodiment, as described above, the measuring apparatus 10 for measuring the properties of the probe card comprises the load sensor (load cell) 11 and the displacement sensor 13. The load sensor 11 may be placed on the main chuck 21, for example, and serves to detect the load from the probe card 26. The displacement sensor 13 detects the displacement (absolute displacement) of the probe card 26 attributable to its deflection, which is caused as the main chuck 21 ascends. The probe card property measuring apparatus 10 according to the present embodiment, which is constructed in the same manner as the actual probe unit 20, measures the absolute displacement of the probe card that is used actually. Thus, the absolute displacement of the actually available probe card 26 under inspection can be measured. Further, the data on the relationship between the overdrive value of the main chuck 21 and the probe pressure can be detected by measuring the absolute displacement using the probe card 26 having probes and the probe card 26' having no probes.

According to the present embodiment, the storage section 30A of the probe unit 20 can be loaded with the data on the relationship between the overdrive value and the probe pressure in accordance with the absolute displacement of the probe card 26 that is obtained by means of the measuring apparatus 10. In order to check the to-be-inspected object for electrical properties, the control device can read the appropriate data on the relationship between the overdrive value and the probe pressure from the control device 30 and optimally control the overdrive value of the main chuck 21, thereby improving the reliability of the inspection.

The absolute displacement of the probe card 26 and the load are measured in the state of FIG. 1 without the use of the test head 28. Alternatively, however, the measuring apparatus 10 can be provided with the test head 28 as the measuring apparatus 10 measures the absolute displacement of the probe card 26 and the load. In this state, the measuring apparatus 10 can be further approximated to the actual probe unit as it measures the absolute displacement of the probe card.

In the embodiment described above, the displacement sensor 13 measures the distance from the flange 12A of the contact block 12. However, the displacement sensor 13 can directly measure the displacement of the probe card (see FIG. 4) by measuring the distance from the probe card. The displacement sensor 13 can also measure the distance from the surface of the main chuck 21 (see FIG. 5). In this case, the positioning plate 21C can have a smaller size than the upper surface of the main chuck 21. In any of these cases, the same functions and effects of the foregoing embodiment can be expected.

Further, the measuring apparatus 10 can measure the properties of a probe card that has bump-type probes.

Furthermore, the measuring apparatus 10 can check the properties of a probe card for checking the electrical properties of a to-be-inspected object, such as an LCD substrate, as well as the device formed on the wafer.

Another embodiment will be described with reference to FIG. 2. According to this embodiment, a measuring apparatus 10 for measuring the properties of a probe card is incorporated in a probe unit 20. As shown in FIG. 2, the measuring apparatus 10 of the present embodiment for measuring the properties of the probe card can be located in a prober chamber of the probe unit 20. The following is a description of the probe unit 20 of the present embodiment.

As shown in FIG. 2, the probe unit 20 comprises a stage (main chuck) 21 that carries a to-be-inspected object (e.g., device formed on a wafer) (not shown) thereon, an X-stage 22 for moving the main chuck 21 in the X-direction, and a Y-stage 23 for moving the X-stage 22 in the Y-direction. The X- and Y-stages 22 and 23 are driven by means of their corresponding drive mechanisms (not shown), and move in the X- and Y-axis directions, respectively. The main chuck 21 is provided with Z- and θ-direction drive mechanisms. These drive mechanisms cause the main chuck 21 to move in the Z- and θ-directions. A head plate 24 is located covering the top face of the prober chamber. The head plate 24 has a circular hole 24A. The hole 24A is fitted with a card clamp mechanism 25. A cardholder 26A of the card clamp mechanism 25 releasably holds a probe card 26. A connecting ring 27 connects the probe card 26 and a test head 28. Electrical information for inspection is transferred between a tester (not shown) and the probe card 26 via the connecting ring 27 and the test head 28. Numeral 27A denotes contact terminals such as pogo pins. A pair of guide rails 29, 29, left and right, are arranged in the prober chamber. These guide rails 29, 29 are guides for the movement of an alignment bridge (not shown), which constitutes an alignment mechanism, between the front and back of the prober chamber. The probe unit 20 is driven under the control of a control device 30. The control device 30 has a storage section 30A that stores the properties of the probe card 26.

As shown in FIG. 2, the measuring apparatus 10 of the present embodiment for measuring the properties of the probe card comprises a load sensor (load cell) 11, a contact block 12, and displacement sensors 13. The load sensor 11 may be placed on the main chuck 21 and serves to detect a load from the probe card 26. The contact block 12 may be located on the load cell 11 and touches the probe card 26. The load sensor 11 or the contact block 12 can be fixed on or removably arranged on the main chuck 21. The load sensor may be provided between the main chuck 21 and the contact block. The displacement sensor detects one of the position of the probe card, the position of the main chuck and the position of the contact block when the probe card and the contact block contact each other and when the stage further moves up and receives a prescribed load from the probe card. As the main chuck 21 ascends, the contact block 12 presses the probe card 26. As this is done, the probe card 26 bends. The displacement sensors 13 detect the displacement (absolute displacement) attributable to this deflection. More specifically, the displacement sensors 13 detect the lift of the contact block 12 that ascends during the time interval that elapses from the instant that the contact block 12 is brought into contact with the probe card 26 until the load cell 11 detects a given load (load equal to the load for the time of wafer inspection). The lift of the contact block 12 is equivalent to the displacement (absolute displacement) that is caused when the probe card 26 is pushed up and bent by the contact block 12.

Any of various types can be used as the load cell 11. The load cell 11 and the contact block 12 of the present embodiment can each be formed in the shape of a circular column, for example. Preferably, a flange 12A is formed on the lower part of the contact block 12. Preferably, the load cell 11 is placed in the center of the main chuck 21. A positioning plate 21C can be used to locate the load cell 11 in the center of the main chuck 21. This positioning plate 21C can be a thin ring-shaped plate that is made of plastics. Its outside diameter can be equal to the outside diameter of the upper surface of the main chuck 21 and its inside diameter can be equal to the outside diameter of the lower end of the load cell 11. Thus, the positioning plate is placed on the upper surface of the main chuck 21, and the load cell 11 is located in its center hole, so that the load cell 11 can be accurately situated in the center of the main chuck 21.

A wire 11B connects the load cell 11 and an indicator 11A. The indicator 11A digitally indicates in kilograms the load from the probes, which is detected by means of the load cell 11.

Various types may be used for the displacement sensors 13. Eddy-current displacement sensors can be used as the displacement sensors 13 of the present embodiment, for example. Wires 13B connect the displacement sensors 13 and indicators 13A. The indicators 13A digitally indicate in microns the distance from a target that is detected by means of the displacement sensors 13. The displacement sensors 13 may each be a ring-shaped plate base of, e.g., metal. The displacement sensors 13 can be arranged in a plurality of positions (e.g., on three spots) at equal spaces in the circumferential direction of the plate base. For convenience' sake, the ring-shaped plate base that has the displacement sensors 13 will hereinafter be referred to as a displacement sensor 13. As shown in FIG. 2, the displacement sensors 13 can be attached to the center of a platelike support 14. As shown in the same drawing, the support 14 that has the displacement sensor 13 is removably set between the pair of guide rails 29, 29, left and right, which constitute the alignment mechanism. The support 14 is situated somewhat below the probe card 26 and above the main chuck 21. The support 14 is formed of a horizontal portion in the center and a slanting portion that inclines downward from the horizontal portion to the opposite ends, left and right. The horizontal portion is formed having a circular hole for the attachment of the displacement sensor 13. The descending ends of the slanting portion have engaging grooves that engage the left- and right-hand guide rails 29, 29, individually.

Preferably, the inside diameter of the displacement sensor 13 is greater than the outside diameter of the contact block 12, as shown in FIG. 2. When the main chuck 21 ascends, the upper part of the contact block 12 can pass through the displacement sensor 13. The flange 12A of the contact block 12 can be formed of metal. The outside diameter of the flange 12A can be made greater than the inside diameter of the displacement sensor 13 and smaller than the outside diameter of the sensor 13.

In this structure, the flange 12A, which is situated right under the displacement sensor 13, can serve as the target of the displacement sensor 13.

The operation of the probe card property measuring apparatus 10 will be described with reference to FIGS. 3A and 3B. The measuring apparatus 10 of the present embodiment for measuring the properties of the probe card is used to measure the properties of the probe card 26 before the wafer inspection.

It will be described how the measuring apparatus 10 is attached to the probe unit 20. The main chuck 21 is located in a probe center (substantially in the center of the prober chamber). The positioning plate is provided on the upper surface of the main chuck. After the load cell 11 is located in the center opening of the positioning plate, the support 14 is set between the left- and right-hand guide rails 29, 29. Thus, prearrangement for the measuring apparatus 10 for measuring the properties of the probe card is finished.

The following is a description of the step in which the measuring apparatus 10 for measuring the properties of the probe card detects the absolute displacement attributable to the deflection of the probe card 26. As shown in FIG. 3A, the main chuck 21 ascends, whereupon the contact block 12 comes into contact with the probe card 26. Whether or not the contact block 12 is brought into contact with the probe card 26 can be determined according to the indication of the indicator 11A of the load cell 11. When the contact block 12 touches the probe card 26, the indicated value on the indicator 13A of the displacement sensor 13 is set to zero.

As shown in FIG. 3B, the main chuck 21 ascends, whereupon the contact block 12 applies a load F to the probe card 26. The main chuck 21 ascends so that the indicator 11A of the load cell 11 detects the given load. As this is done, the entire mounting surface of the probe card 26, covering the probe card 26, card clamp mechanism 25, and head plate 24 in one, gradually bends from the position indicated by broken line, as shown in FIG. 3B. The indicator 13A of the displacement sensor 13 indicates the distance of ascent of the contact block 12 in microns as the absolute displacement of the entire mounting surface of the probe card 26. The main chuck 21 stops when the indicator 11A of the load cell 11 indicates the given load (necessary load for the wafer inspection). The value then indicated by the indicator 13A of the displacement sensor 13 is the absolute displacement of the probe card 26 obtained when the wafer is checked. Data on the relationship between the load on the probe card 26 and the absolute displacement of the probe card 26 can be obtained by this series of operations.

FIGS. 3A and 3B illustrate the principle of determining the relationship between the absolute displacement of the probe card 26' having no probes and the load applied to the card 26'. However, the absolute displacement of the probe card 26 having probes can be measured in the same manner. The difference between this measurement result and the result of measurement using the probe card 26' having no probes is equivalent to the overdrive value of the main chuck 21. Data on the relationship between the overdrive value and the probe pressure can be obtained from this result. The to-be-inspected object (e.g., device formed on the wafer) can be checked under an appropriate probe pressure by the controlling the probe unit 20 in accordance with the data on the relationship between the overdrive value and the probe pressure.

In some cases, the inspection of the to-be-inspected object must be carried out at various temperatures from low temperature to high temperature. According to the present embodiment, absolute displacements can be obtained individually at a plurality of temperatures by using the measuring apparatus 10 for measuring the properties of the probe card. The data on the relationship between the overdrive value and the probe pressure based on these measurement results can be stored in the storage section 30A of the control device 30 of the probe unit 20, for example. In checking the to-be-inspected object, the data on the relationship between the overdrive value and the probe pressure for a given inspection temperature is read from the storage section 30A. By controlling the main chuck 21 in accordance with this relationship data, an appropriate overdrive value can be secured, and the to-be-inspected object can be checked for electrical properties under the appropriate probe pressure, so that the reliability of the inspection can be improved.

The following is a description of the steps of procedure for the case where the probing method of the present invention is carried out by the use of the measuring apparatus of the present embodiment.

Before the inspection of the to-be-inspected object, the absolute displacement of the probe card 26 is obtained in the manner described above. Based on this absolute displacement, the data on the relationship between the overdrive value and the probe pressure is stored in the control device 30 (storage section 30A) of the probe unit 20. If this inspection is carried out at different temperatures, absolute displacements for the individual temperatures are obtained, and the data on the relationship between the overdrive value and the probe pressure based on these absolute displacements are stored in the storage section 30A. When the to-be-inspected object is checked, the data on the relationship between the overdrive value and the probe pressure corresponding to the inspection temperature of the to-be-inspected object is read from the storage section 30A. The overdrive value of the main chuck 21 is controlled in accordance with the data on the relationship between the overdrive value and the probe pressure. More specifically, the to-be-inspected object is placed on the main chuck 21 of the probe unit 20. As the main chuck 21 moves in the X-, Y-, and Z-axis directions under the control of the control device 30, the probes of the probe card come into contact with the electrodes of the to-be-inspected object. The main chuck 21 is driven for an optimum overdrive value under the control of the control device 30, whereupon the probes of the probe card 26 come into contact with the electrodes under an optimum probe pressure. In this contact state, the to-be-inspected object can be checked for electrical properties.

According to the present embodiment, as described above, the measuring apparatus 10 for measuring the properties of the probe card comprises the load sensor (load cell) 11 and the displacement sensor 13. The load sensor 11 is placed on the main chuck 21 and serves to detect the load from the probe card 26. The displacement sensor 13 detects the displacement (absolute displacement) of the probe card 26 that is pressed by the main chuck 21. The measuring apparatus 10 for measuring the properties of the probe card can measure the absolute displacement of the probe card 26 that is actually used for inspection, not the alternative to the probe card for the conventional case.

The data on the relationship between the overdrive value of the main chuck 21 and the probe pressure can be obtained by using the probe card having probes to carry out the same measurement.

According to the present embodiment, the data on the relationship between the overdrive value and the probe pressure can be previously loaded into the storage section 30A of the probe unit 20 in accordance with the absolute displacement of the probe card 26 (entire mounting surface covering the probe card 26) that is obtained with use of the measuring apparatus 10 for measuring the properties of the probe card. When the to-be-inspected object is checked, the data on the relationship between the overdrive value and the probe pressure is read from the storage section 30A, and the control device 30 can optimally control the overdrive value of the main chuck 21. In consequence, the overdrive value of the main chuck 21 can be accurately managed at the time of wafer inspection and the to-be-inspected object can always be checked for electrical properties under the appropriate probe pressure, so that the reliability of the inspection can be improved.

FIGS. 3A and 3B show the way the absolute displacement of the probe card 26 and the load are measured without the use of the test head 28. In an actual working state such that the test head 28 is in contact with the probe card 26, as shown in FIG. 2, the absolute displacement of the probe card 26 and the load can be measured in the same manner as in the case shown in FIGS. 3A and 3B. Further, an appropriate overdrive value for the main chuck 21 under inspection can be set, and an appropriate probe pressure can be applied to the wafer, so that high-reliability wafer inspection can be effected.

In the embodiment described above, the displacement sensor 13 measures the distance from the flange 12A of the contact block 12. The displacement sensor can directly measure the displacement of the probe card by measuring the distance from the probe card (see FIG. 4). The displacement sensor 13 can also measure the distance from the surface of the main chuck 21 (see FIG. 5). In either of these cases, the same functions and effects of the foregoing embodiment can be expected. Most desirably, however, the displacement sensor should directly measure the displacement of the probe card.

The properties of a probe card that has bump-type probes can be also measured. The invention is also applicable to the inspection of any to-be-inspected object other than a wafer, e.g., an LCD substrate or the like.

According to the embodiments of the present invention, the absolute displacement of the probe card under inspection or the entire mounting surface covering the probe card can be measured. According to the embodiments of the present invention, the data on the relation between the overdrive value of the stage and the load can be obtained, and the appropriate overdrive value can be set in accordance with the data. The measuring apparatus 10 can measure the absolute displacement of the probe card under inspection or the entire mounting surface covering the probe card, and moreover, the appropriate overdrive value can be set in accordance with the data on the relation between the overdrive value of the stage and the load.

What is claimed is:

1. A measuring apparatus for measuring the properties of a probe card, comprising:
   a stage;
   a holding mechanism located over the stage, the holding mechanism holding one of a probe card having probes and a probe card having no probes;
   a lift mechanism which causes the stage to ascend and descend toward the probe card;
   a load sensor which detects the load the stage receives from the probe card when the lift mechanism raises toward and brings the stage into contact with the probe card; and
   a displacement sensor which detects the absolute displacement of the probe card, which has been caused by the load.

2. A measuring apparatus according to claim 1, further comprising a contact block provided on the stage.

3. A measuring apparatus according to claim 2, wherein the load sensor is provided between the stage and the contact block.

4. A measuring apparatus according to claim 2, wherein the displacement sensor detects a displacement of the contact block.

5. A measuring apparatus according to claim 2, wherein the displace sensor detects the position of the contact block when the probe card and the contact block contact each other and when the stage further moves up and receives a prescribed load from the probe card.

6. A measuring apparatus according to claim 1, wherein the load sensor is provided on the stage.

7. A measuring apparatus according to claim 6, further comprising a positioning plate for positioning the load sensor on a center part of the stage.

8. A measuring apparatus according to claim 1, wherein the displacement sensor detect at least one of the displacement of the probe card and the displacement of the stage.

9. A measuring apparatus according to claim 1, wherein the displacement sensor detect at least one of the position of the probe card and the position of the stage when the probe card and the stage contact each other and when the stage further moves up and receive a prescribed load from the probe card.

10. A probe apparatus for inspecting the electrical properties of an to-be-inspected object, comprising:
    a stage which holds the to-be-inspected object;
    a holding mechanism which is provided above the stage, the holding mechanism holding one of a probe card having a plurality of probes and a probe card having no probes;
    a lift mechanism which moves up the stage toward the probe card and moving down the stage from the probe card;
    a load sensor which is removable and detects a load which the stage receives from the probe card when the lift mechanism moves up the stage; and
    a displacement sensor which is removable and detects an absolute displacement which the probe card undergoes upon receiving the load.

11. A probe apparatus according to claim 10, further comprising a contact block which is removably provided on the stage.

12. A probe apparatus according to claim 11, wherein the load sensor is provided between the stage and the contact block.

13. A probe apparatus according to claim 10, further comprising a storage unit which stores data which represents a relation between an over-drive distance and a probe pressure of the probe, the over-drive distance and the probe pressure being based on the absolute displacements measured at different temperatures.

* * * * *